(12) United States Patent
Pfannenberg

(10) Patent No.: US 8,727,842 B2
(45) Date of Patent: May 20, 2014

(54) FILTER FAN WITH A QUICK FASTENING DEVICE

(75) Inventor: Andreas Pfannenberg, Hamburg (DE)

(73) Assignee: Pfannenberg GmbH, Hamburg (DE)

( * ) Notice: Subject to any disclaimer, the term of this patent is extended or adjusted under 35 U.S.C. 154(b) by 544 days.

(21) Appl. No.: 11/811,268

(22) Filed: Jun. 8, 2007

(65) Prior Publication Data

US 2008/0045133 A1    Feb. 21, 2008

(30) Foreign Application Priority Data

Jun. 13, 2006    (DE) .................... 20 2006 009 355 U

(51) Int. Cl.
F25D 17/04    (2006.01)

(52) U.S. Cl.
USPC ........................................................ 454/184

(58) Field of Classification Search
USPC ........................................................ 454/184
See application file for complete search history.

(56) References Cited

U.S. PATENT DOCUMENTS

| | | | |
|---|---|---|---|
| 3,204,546 A * | 9/1965 | Krell ............................ | 454/272 |
| 4,834,615 A | 5/1989 | Mauch et al. | |
| 5,022,900 A | 6/1991 | Bar-Yona et al. | |
| 6,099,611 A | 8/2000 | Pawlowski et al. | |
| 6,189,848 B1 | 2/2001 | Barnett et al. | |
| 6,517,598 B2 | 2/2003 | Anderson et al. | |
| 2002/0094772 A1 | 7/2002 | Gough | |
| 2005/0144914 A1* | 7/2005 | Huehn et al. ................... | 55/471 |
| 2008/0045133 A1 | 2/2008 | Pfannenberg | |

FOREIGN PATENT DOCUMENTS

| | | |
|---|---|---|
| DE | 93 06 032 | 12/1993 |
| DE | 195 36 928 | 1/1997 |
| DE | 202006009355 | 9/2006 |
| EP | 0352113 | 1/1990 |
| EP | 0 439 667 | 8/1991 |
| EP | 1370125 | 12/2003 |
| EP | 1262095 B1 | 9/2004 |
| EP | 1 720 395 | 11/2006 |
| ES | 2038466 T3 | 7/1993 |
| FR | 2704366 A1 | 10/1994 |
| RU | 2281421 C2 | 8/2006 |

* cited by examiner

*Primary Examiner* — Steven B McAllister
*Assistant Examiner* — Samantha Miller
(74) *Attorney, Agent, or Firm* — Lucas & Mercanti, LLP; Klaus P. Stoffel

(57) ABSTRACT

A filter fan includes a basic housing with a frame, wherein the frame is equipped with a quick fastening device in the form of spring-elastic clips. In order to prevent air and/or moisture from penetrating into a housing, the frame extends continuously and without openings around a circumference. The clips are molded onto the frame.

9 Claims, 7 Drawing Sheets

FILTER FAN WITH A QUICK FASTENING DEVICE

BACKGROUND OF THE APPLICATION

1. Field of the Invention

The present invention relates to a filter fan with a basic housing with a frame, wherein the frame is equipped with a quick fastening device in the form of spring-elastic clips.

2. Description of the Related Art

Filter fans are used to ventilate switch cabinets, electronic control devices and computers which are inserted into a corresponding opening in a housing wall, such as that of a switch cabinet. The filter fans have a blower in order to draw ambient air into the housing, wherein the housing is additionally equipped with air outlet slits. In order to prevent contamination of the electronic devices in the housing, the filter fan has a filter device, for example, a replaceable filter mat.

A filter fan of this type is known from EP 0 439 667 B1, wherein the filter fan has a basic housing with a frame. Quick fastening devices are provided on the frame in the form of spring-elastic clips, in order to insert the filter fan without additional screws or other mounting devices and without tools into a housing opening, and there to latch into place in the housing opening with the aid of the spring-elastic clips.

However, a disadvantage here is that the spring-elastic clips are cut out of the side walls or the frame of the basic housing of the filter fan, so that during operation of the filter fan, unfiltered air can be sucked in through these side openings into the interior of the housing, for example, a computer housing.

SUMMARY OF THE INVENTION

The object of the invention is to provide a filter fan of the type named in the introduction in which the intake of unfiltered air is avoided.

This object is attained, in accordance with the present invention, the frame extends continuously and without openings around its circumference and the clips are molded onto the frame.

With a filter fan designed in accordance with the invention, the quick fastening devices in the form of spring-elastic clips are not cut out of a section of a side wall or a frame of the basic housing of the filter fan, but are moulded onto the outer side of the frame, or on the side walls. Preferably, the filter fan or its basic housing consists of a plastic, injection-moulded part, so that when the frame is produced, the additional clips can already be moulded or formed on it as a single piece with the frame. Here, the clips are arranged virtually on the outer side on frame, and for example point outwards in a recess in a mounting wall when the filter fan is mounted. Furthermore, the frame is designed in such a manner that it extends continuously around the circumference of the filter fan, for example as a single component.

It is understood that the filter fan can additionally be equipped in the known manner with a filter mat and/or a blower and/or air guidance devices or the like. Naturally, slats which act as air guidance devices can also be constructed so that they can be pivoted. In principle, it is possible that only one single clip or several spring-elastic clips, preferably of the type described below, can be arranged on the frame.

The advantage of the invention is that due to the additional forming of spring-elastic clips on the frame of the filter fan, no further openings are present in the side outer walls, and the frame is essentially designed to run continuously and without openings around the circumference of the filter fan. As a result, unfiltered air is effectively prevented from penetrating, for example into a computer housing. Equally, no water can penetrate through the side walls into the interior of the filter, and a filter mat can therefore no longer become saturated with moisture.

The form of the filter fan can here be selected as required according to the invention; however, the filter fan is preferably rectangular, circular or oval.

The filter fan has essentially been described above in connection with switch cabinets, electronic control devices, computers or similar. However, it is possible to also use filter fans of this type in all other fields of technology, such as filter fans which are inserted into an opening of a construction site in order to ventilate an interior room of a building. In this case, the housing of the filter fan can be made of metal.

Particularly when mounting onto computer housing, switch cabinets or similar, the housing of which usually consists of thin-walled metal and/or plastic, it is recommended that a gap between an upper edge of a clip and a wall surface which forms a mounting wall contact edge which extends around be between one and four millimetres in size. In order to mount the filter fan, the basic housing is inserted into a prepared recess in the mounting wall, wherein the dimensions of the recess in the mounting wall correspond approximately to the outer dimensions of the frame of the basic housing. When the basic housing is inserted into the recess in the mounting wall, the spring-elastic clips are pressed down in the direction of the frame, or of its side walls. When the frame with its mounting wall contact edge has been brought into contact on the wall surface which borders the recess in the mounting wall, the spring-elastic clips spring back into their original position, and virtually lock the basic housing to the mounting wall. In order to release the filter fan, the spring-elastic clips can be pressed down with a suitable tool, such as a screwdriver, in order to be able to pull the basic housing back out of the recess. With the gap described above, the filter fan can, for example, be used on a thin-walled housing of a computer.

In order to position the spring-elastic clips, it is recommended that they be arranged on an upper and/or a lower side of a quadratic or rectangular filter fan, on one corner section in each case. In this way, the filter fan can for example be fastened to a housing in a simple manner with just two clips on the upper or lower side or with four clips on the upper or lower side. In principle, the clips can also be arranged on a right-hand side and a left-hand side of the filter fan.

Furthermore, the clips can be arranged on a right-hand side wall and/or a left-hand side wall of the filter fan, and in principle also on all four side walls. If only one clip is provided for each side wall of the housing, it should preferably be arranged in the center, in order to achieve symmetrical retaining forces.

For improved sealing of the filter fan inserted into a recess of the mounting wall, a sealing means is applied to the mounting wall contact edge in order to prevent air and/or moisture from penetrating between the mounting wall contact edge and a housing wall or mounting wall. In particular, the sealing means is designed in the form of a rubber seal made of a material which is suitable for this purpose, which is inserted into a groove which extends continuously around the mounting wall contact edge. The rubber seal can also be glued into place.

With regard to the form of the clips, it is recommended that they be triangular or rectangular. Here, the form, thickness and dimensions of the clips can be selected by persons familiar in the art depending on the quantity of the clips and their positions, as well as on the retaining forces required, i.e., essentially depending on the form and size of the filter fan.

In order to increase the ventilation performance, several filter fans with clips and frames constructed according to the invention can be inserted into an appropriately sized recess in the mounting wall. For this purpose, connection elements are provided which can in particular be latched together in each case with the clips of two adjacent filter fans, in order to attain a detachable connection between adjacent filter fans. Here, the connection element can be designed in any way required.

The various features of novelty which characterize the invention are pointed out with particularity in the claims annexed to and forming a part of the disclosure. For a better understanding of the invention, its operating advantages, specific objects attained by its use, reference should be had to the drawing and descriptive matter in which there are illustrated and described preferred embodiments of the invention

DETAILED DESCRIPTION OF THE INVENTION

Figure 1:
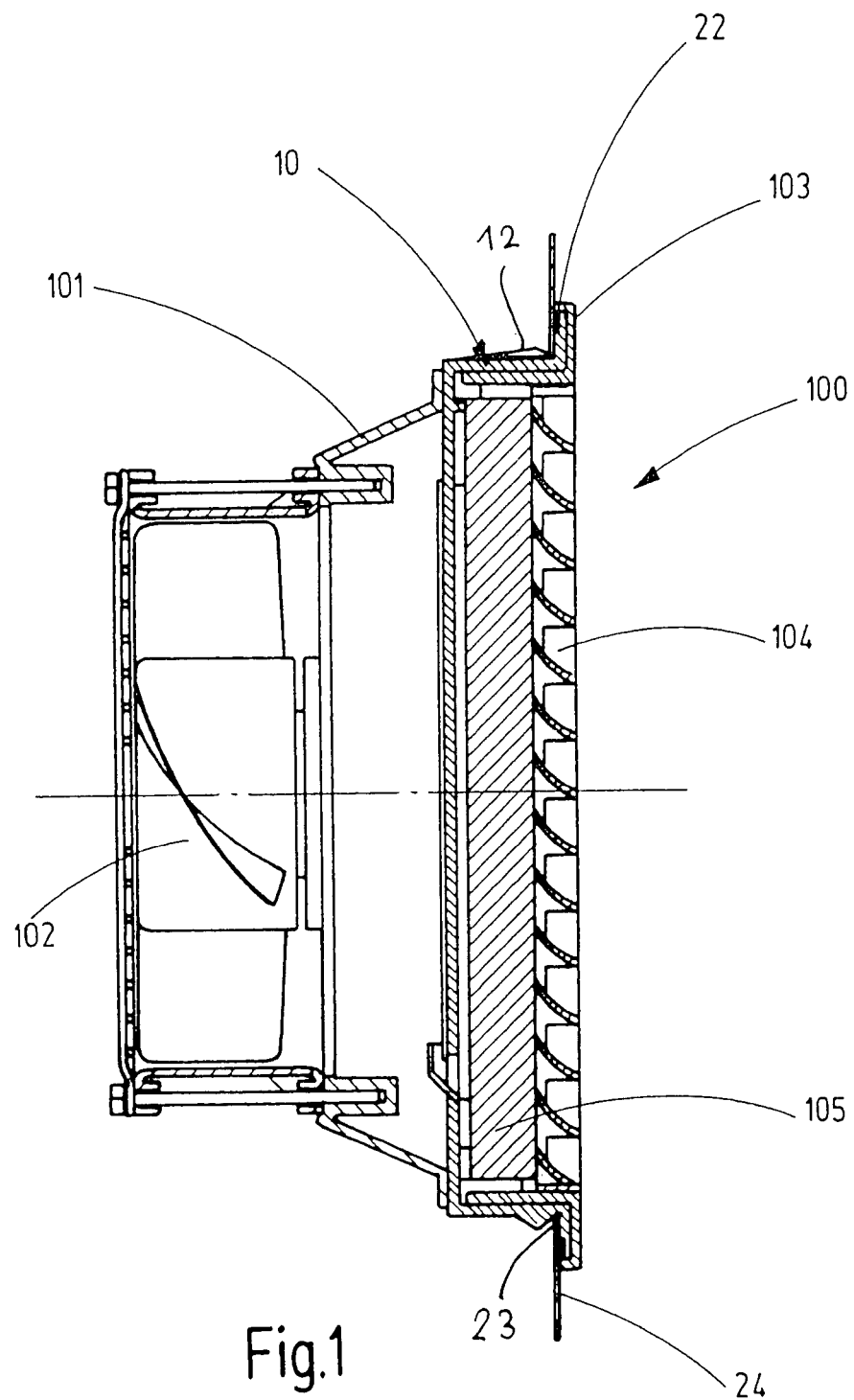
FIG. 1 is a vertical sectional view of a filter fan.
Figure 2:
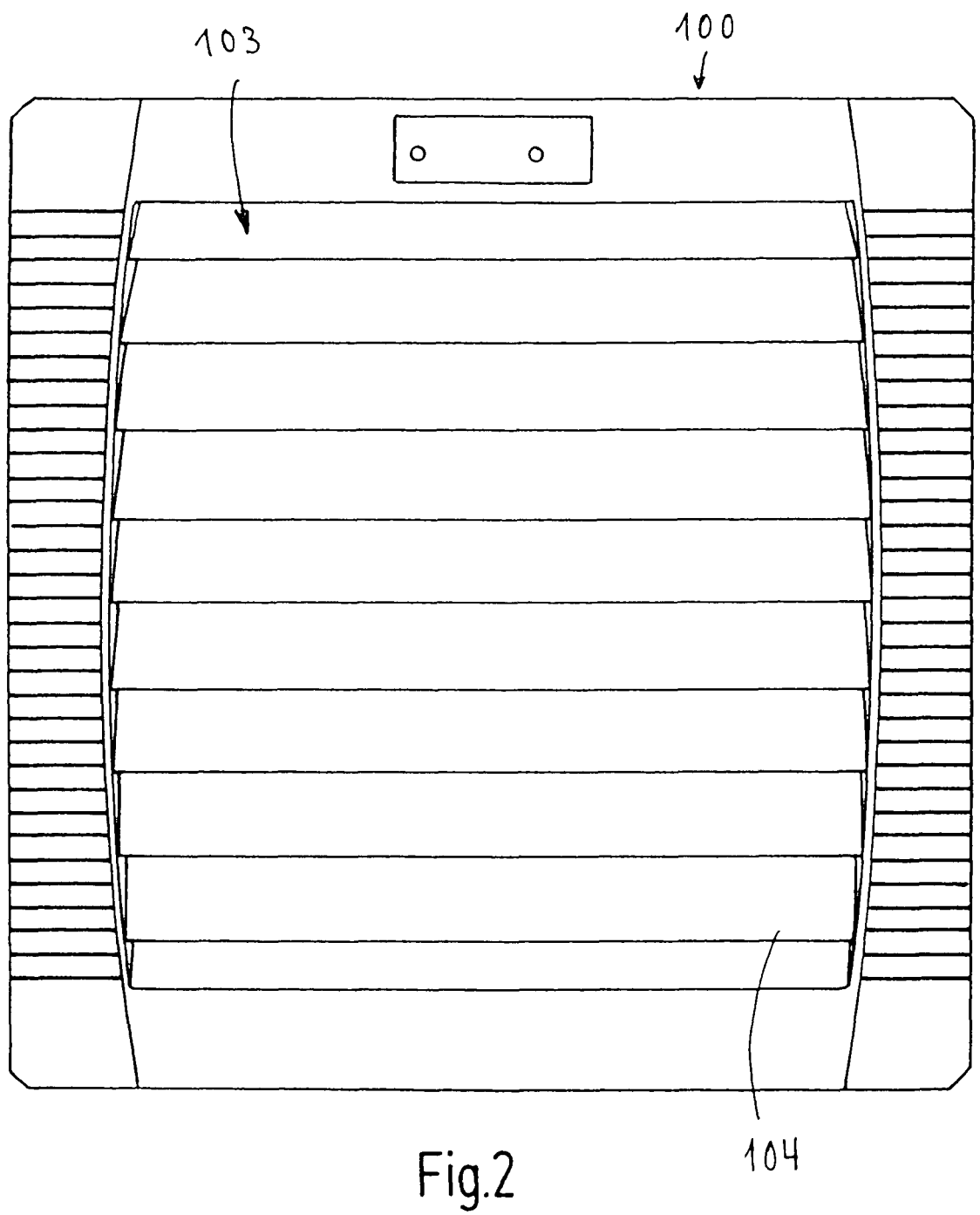
FIG. 2 is a view from the front onto the filter fan.
Figure 3:
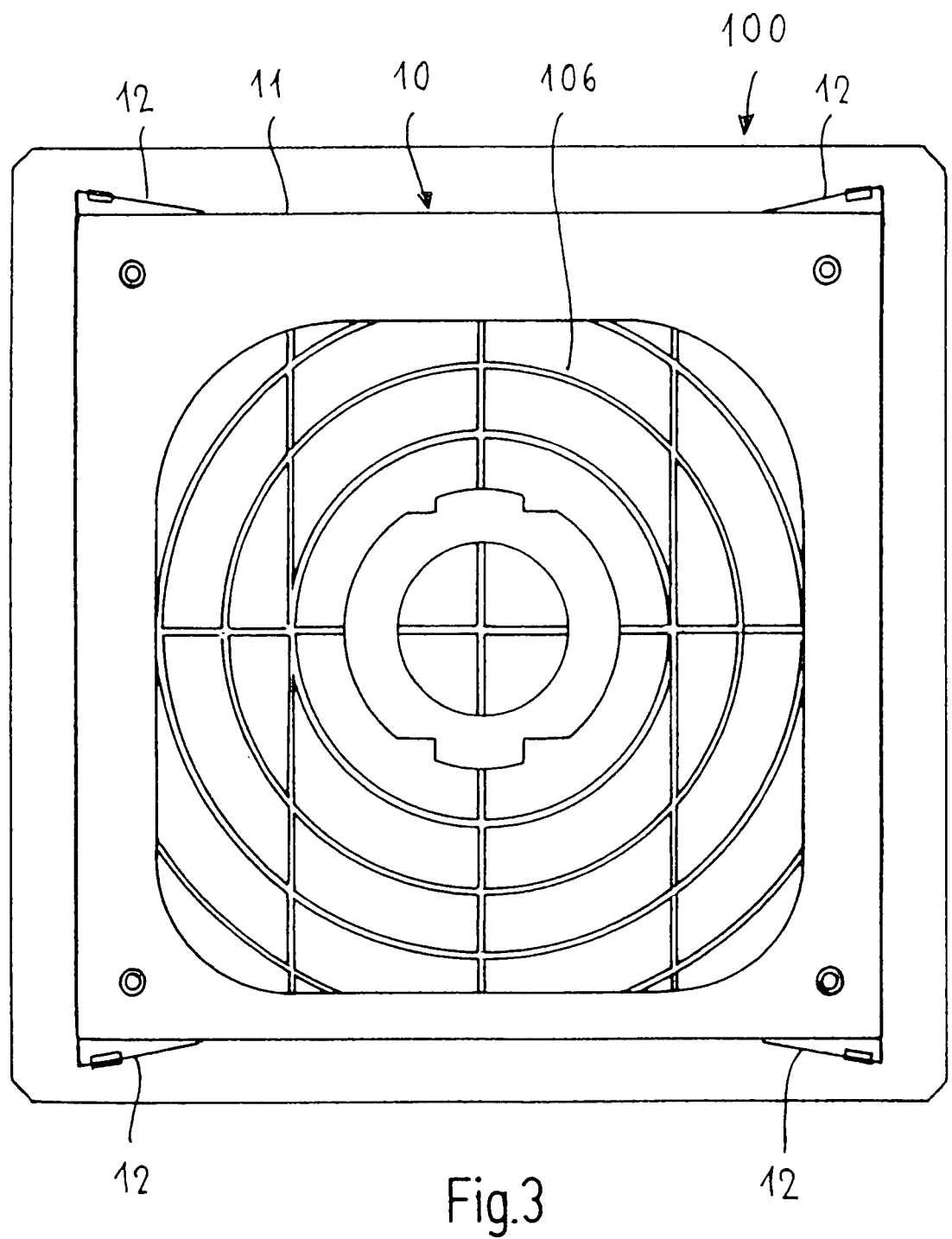
FIG. 3 is rear view of the filter fan with wing-type clips for quick fastening of the filter fan to a mounting wall.
Figure 4:
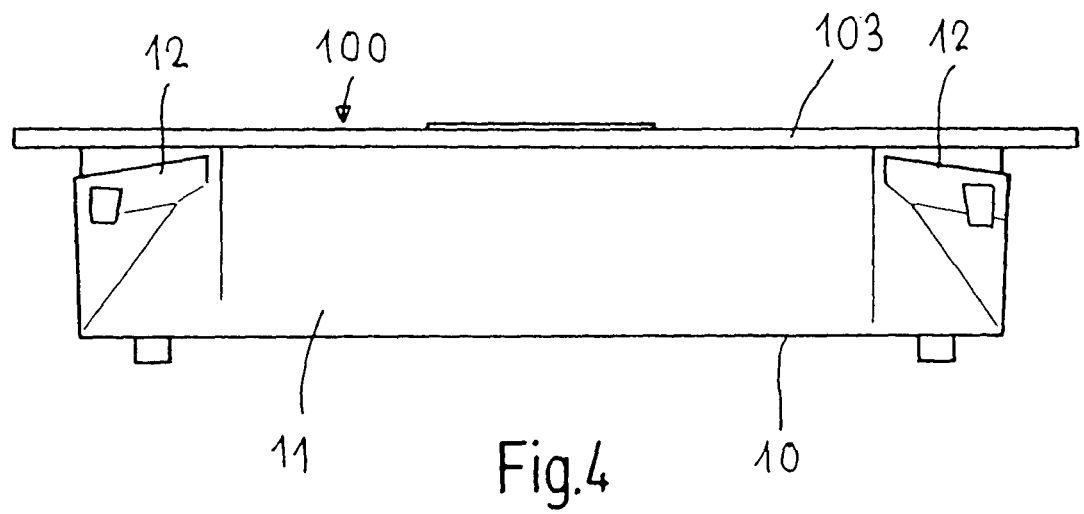
FIG. 4 is a top view onto the frame of the filter fan with the wing-type clips.
Figure 5:
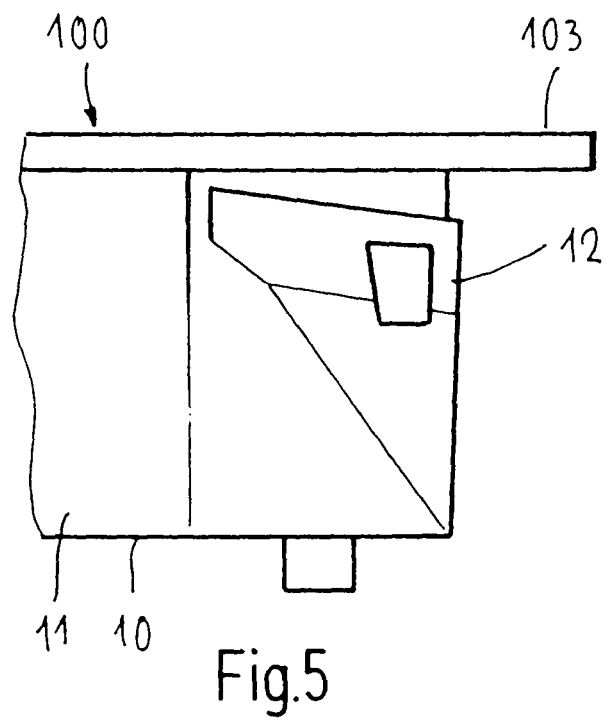
FIG. 5 is an enlarged view of a section of the frame of the filter fan with a wing-type clip.
Figure 6:
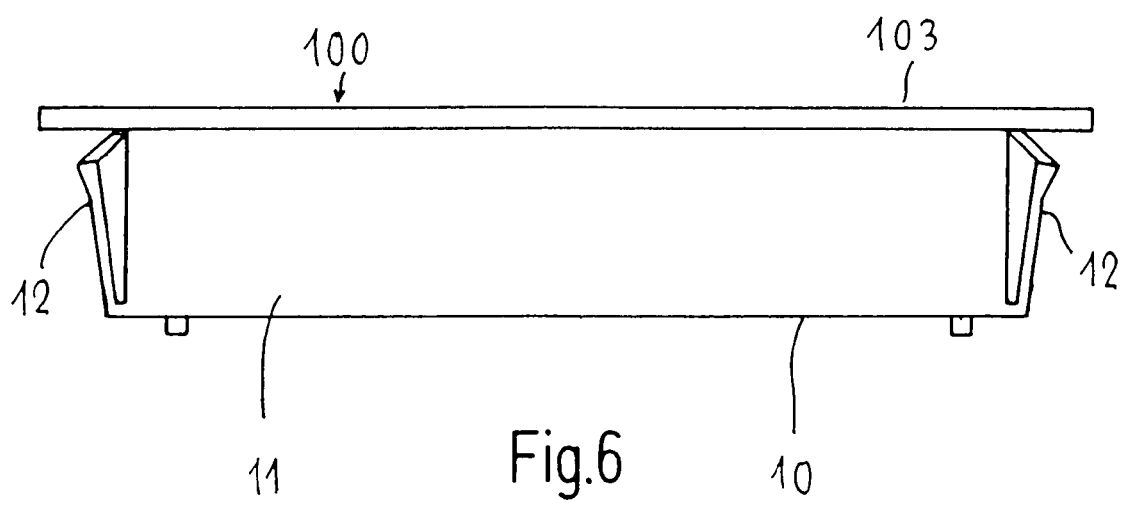
FIG. 6 is a further top view onto the frame of the filter fan with the wing-type clip.
Figure 8:
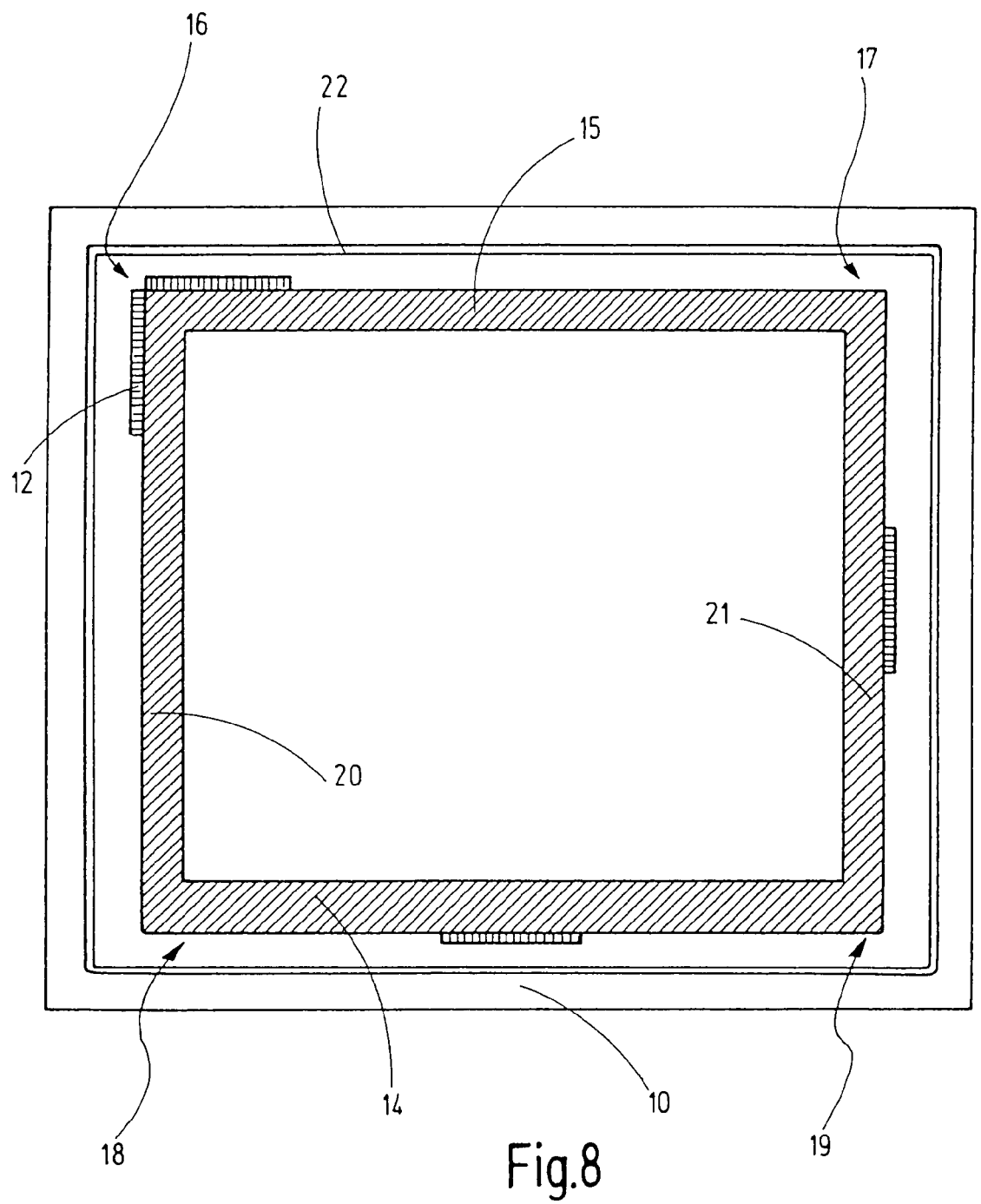
FIG. 8 is a plan view of a filter fan.

The filter fan 100 shown in FIGS. 1 to 3 includes a basic housing 10 with a blower carrier 101 which contains a blower 102 driven by an electric motor. The rear wall of the blower carrier 101, which is open, is closed by means of a protective grid 106 (FIG. 3). A frame 11 is preferably molded on the basic housing 10. With a quadratic or rectangular filter fan 100, the frame 11 consists of four side walls 14, 15, 20, 21 (FIG. 8).

The basic housing 10 has on its front side a design support 103 with air guidance devices, for example in the form of slats 104 (FIGS. 1 and 2). The design support 103 on the basic housing 10 holds a filter mat 105 for filtering the air which travels through the filter fan 100. The filter fan 100 is made of one or more plastic injection moulded parts and/or of metal parts. The designed retainer 103 is preferably detachably connected with the basic housing 10 via a circumferentially extending seal 22, in order to be able to replace the filter mat 105 (FIG. 1).

When installed, the filter fan 100 with its basic housing 10 is arranged in a recess 23 in a mounting wall 24, e.g. of a switch cabinet (FIG. 1).

Figure 7:
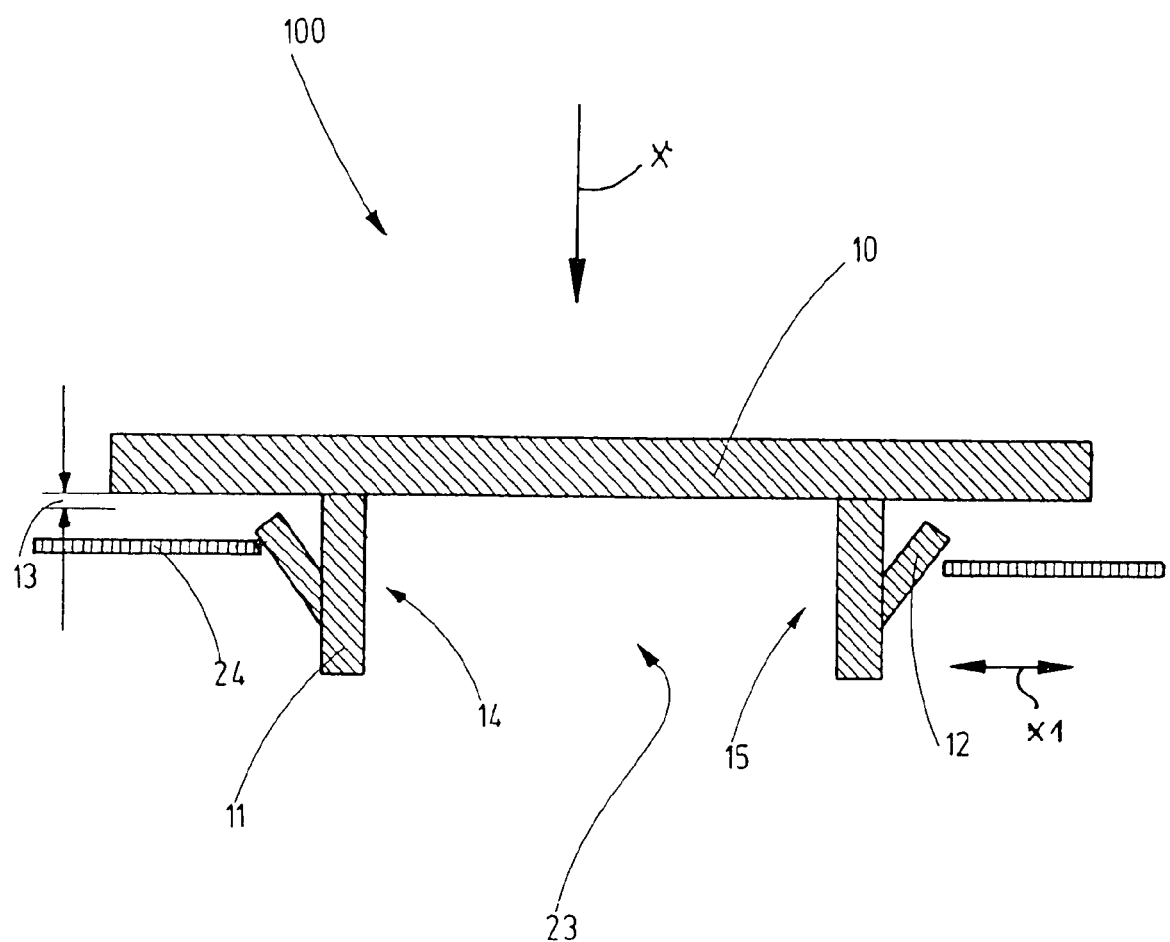
FIG. 7 shows a filter fan in cross-section.

In order to fasten the filter fan 100 in a detachable manner in the recess 23 of the mounting wall 24, the filter fan 100 is inserted into the recess 23 as shown by the arrow X (FIG. 7). Here, the wing-type, spring-elastic clips 12 which are moulded on the frame 11, as shown by the double arrow X1, can be slightly bent towards the center of the recess 23. The clips 12 are preferably molded as a single piece with the side sections 14, 15, 20, 21 of the frame 11 (FIGS. 3, 4, 5, 6 and 7).

As soon as the filter fan 100 has been pushed far enough into the recess 23, the clips 12 spring back into their original position and lock the filter fan 100 into its inserted position. In order to remove the filter fan 100, the clips 12 can be pressed gently back towards the inside.

In order to affix the filter fan 100 to a metal or plastic housing of, for example, a computer or a switch cabinet, the distance or gap 13 between an upper edge 25 of a clip 12 and a mounting wall contact edge of the basic housing 10 is preferably selected to be within a range of between one and four millimeters.

Here, the clips 12 can either be arranged in each case on a corner section 16, 17, 18, 19, as shown on the frame 11 in FIG. 8 on the top left-hand side, or in the center on a side wall 14, 15, 20, 21 as shown in FIG. 8 on the lower right-hand side. The clips 12 can also be distributed freely as required on the frame 11. The clips 12 can be formed in any way required, but are preferably triangular or rectangular. The clips 12 are not formed out of the wall material of the frame 11, but are molded on (FIG. 6), so that the side walls 14, 15, 20, 21 of the frame 11 form closed wall surfaces.

The number of clips 12 can be selected as required, as can their arrangement on the frame 11. As well as arranging the clips 12 in the corner sections 16, 17, 18, 19, clips 12 can also be provided in the central side wall sections of the frame 11. At least two clips 12 should be provided on opposite side walls of the frame 11. The clips 12 preferably are of the same material as the frame 11, but the clips have a spring-elastic design as a result of which the clip 12 can spring back into place after the pressure applied to the clips is removed.

In order to seal the filter fan 100 when mounted, i.e. when the mounting wall contact edge or the basic housing 10 is essentially flush in contact with its surface on the mounting wall 24, a rubber seal 22 which runs continuously around the filter fan 100 is provided. The seal 22 is made of a plastic material suitable for this purpose. In particular, the rubber seal 22 is glued into a groove in order to prevent air and/or moisture from entering between the filter fan 100 and the mounting wall 24.

While specific embodiments of the invention have been shown and described in detail to illustrate the inventive principles, it will be understood that the invention may be embodied otherwise without departing from such principles.

I claim:

1. A filter fan having a quadratic or rectangular shape said filter fan comprising a basic housing with a frame, said frame having spring-elastic clips for detachably mounting the filter fan in an opening in a mounting wall of a switchgear cabinet, wherein the frame comprises four side walls and mounting wall contact flanges, said mounting wall contact flanges extending outwardly from the side walls, wherein the four side walls are arranged perpendicular to a plane of a mounting wall of the switchgear cabinet, and the mounting wall contact flanges are arranged parallel to the mounting wall of the switchgear cabinet, said mounting wall contact flanges being in contact with the mounting wall of the switchgear cabinet when the frame of the basic housing of the filter fan is mounted in the opening of the mounting wall of the switchgear cabinet, wherein the four side walls have outer dimensions corresponding to dimensions of the opening of the mounting wall, wherein the four side walls and the mounting wall contact flanges of the frame extend continuously and without openings around a circumference of the filter fan so that the four side walls and the mounting wall contact flanges of the frame form continuously closed outer peripheral wall surfaces, wherein the spring-elastic clips are molded onto an outer side of the outer peripheral surface of the side walls of the frame, wherein the spring-elastic clips are not cut out of the side walls of the frame, wherein a gap exists between an outer edge of each of the spring-elastic clips and the mounting wall contact flanges of the frame of the basic housing of the filter fan, wherein the gap is between one and four millimeters in size.

2. The filter fan according to claim 1, wherein the spring-elastic clips are wing-type clips.

3. The filter fan according to claim 1, wherein on an upper side and/or on a lower side of the filter fan one of the spring-elastic clips is arranged on each corner section.

4. The filter fan according to claim 1, wherein one of the spring-elastic clips is arranged on each of one or more side walls of the frame.

5. The filter fan according to claim 4, wherein the spring-elastic clip is arranged essentially in a center of the side wall.

6. The filter fan according to claim 1, wherein at least one of the spring-elastic clips is provided on each of two opposite side walls of the frame.

7. The filter fan according to claim 1, wherein the spring-elastic clips are triangular and/or rectangular.

8. The filter fan according to claim 1, wherein the filter fan is connectable with further filter fans of the same type by means of connection elements.

9. The filter fan according to claim 8, wherein the connection elements can be connected to the spring-elastic clips by latching together.

* * * * *